(12) United States Patent
Wojtecki et al.

(10) Patent No.: US 12,319,781 B2
(45) Date of Patent: Jun. 3, 2025

(54) REHEALABLE AND REWORKABLE POLYMER FOR ELECTRONIC PACKAGING

(71) Applicant: International Business Machines Corporation, Armonk, NY (US)

(72) Inventors: Rudy J. Wojtecki, San Jose, CA (US); Gregory Breyta, San Jose, CA (US); Kamal K. Sikka, Poughkeepsie, NY (US); Teddie P. Magbitang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/651,301

(22) Filed: Feb. 16, 2022

(65) Prior Publication Data
US 2023/0257513 A1     Aug. 17, 2023

(51) Int. Cl.
*C08G 59/50*     (2006.01)
*C08G 59/24*     (2006.01)
*C08G 59/64*     (2006.01)
*C08L 63/00*     (2006.01)

(52) U.S. Cl.
CPC ......... *C08G 59/5033* (2013.01); *C08G 59/24* (2013.01); *C08G 59/64* (2013.01); *C08L 63/00* (2013.01); *C08L 2203/20* (2013.01)

(58) Field of Classification Search
CPC .... C08G 59/5033; C08G 59/24; C08G 59/64; C08L 63/00; C08L 2203/20
USPC ....................................................... 523/414
See application file for complete search history.

(56) References Cited

U.S. PATENT DOCUMENTS

| | | | |
|---|---|---|---|
| 5,726,391 A | 3/1998 | Iyer | |
| 5,760,337 A | 6/1998 | Iyer et al. | |
| 5,965,673 A * | 10/1999 | Hermansen | .......... C08G 59/066 |
| | | | 523/427 |
| 6,632,881 B1 * | 10/2003 | Tsuchida | ............... H01L 23/293 |
| | | | 525/65 |
| 6,919,420 B2 | 7/2005 | Buchwalter et al. | |
| 7,012,120 B2 | 3/2006 | Klemarczyk | |
| 7,041,331 B2 | 5/2006 | Lamola | |
| 7,108,914 B2 | 9/2006 | Skipor et al. | |
| 7,352,069 B2 | 4/2008 | Hazeyama et al. | |
| 7,449,362 B2 | 11/2008 | Gotoh | |
| 8,093,105 B2 | 1/2012 | Manepalli | |

(Continued)

FOREIGN PATENT DOCUMENTS

| | | | | |
|---|---|---|---|---|
| CN | 105073846 A | | 11/2015 | |
| CN | 110804335 A | * | 2/2020 | ............... C09D 5/34 |

(Continued)

OTHER PUBLICATIONS

Pei et al., CN 110804335 A machine translation in English, Feb. 18, 2020 (Year: 2020).*

(Continued)

*Primary Examiner* — David T Karst
(74) *Attorney, Agent, or Firm* — Kelsey Skodje

(57) ABSTRACT

A composition, process, and device are disclosed. The composition includes a polymer formed by reacting an epoxy compound with an amine curing agent. The epoxy compound comprises a Diels-Alder dimer and an ester moiety. The process includes providing a polymer formed by reacting the epoxy compound with the amine curing agent. The device includes a material that includes the polymer.

20 Claims, 8 Drawing Sheets

(56) References Cited

U.S. PATENT DOCUMENTS

| | | | |
|---|---|---|---|
| 8,481,615 | B2 | 7/2013 | Guadagno et al. |
| 9,938,437 | B2 | 4/2018 | Champagne |
| 10,472,548 | B2 | 11/2019 | Champagne |
| 2010/0222525 | A1* | 9/2010 | Ichiryu ............... C08G 59/306 |
| | | | 525/476 |
| 2015/0322309 | A1 | 11/2015 | Hu |
| 2019/0010275 | A1* | 1/2019 | Aspin ............... C08G 59/5026 |
| 2019/0248953 | A1* | 8/2019 | Christensen ............. C08K 5/14 |
| 2022/0017797 | A1 | 1/2022 | Rhodes |
| 2023/0257513 | A1 | 8/2023 | Wojtecki |
| 2024/0409692 | A1 | 12/2024 | Magbitang et al. |

FOREIGN PATENT DOCUMENTS

| | | | | |
|---|---|---|---|---|
| CN | 112210194 | A | * 1/2021 | ............. C08L 63/02 |
| CN | 113166615 | A | 7/2021 | |
| EP | 3071623 | A1 | 9/2016 | |
| EP | 2976380 | B1 | 10/2018 | |
| WO | 0079582 | A1 | 12/2000 | |
| WO | 2007142654 | A1 | 12/2007 | |
| WO | 2014153513 | A1 | 9/2014 | |
| WO | 2023156145 | A1 | 8/2023 | |

OTHER PUBLICATIONS

Rong et al., CN 112210194 A machine translation in English, Jan. 12, 2021. (Year: 2021).*

Sridhar et al., "High-Performance Reworkable Underfill Adhesives Based on Dicyclopentadiene Epoxy Thermoset", IntechOpen, 2022, DOI: http://dx.doi.org/10.5772/intechopen. 107334, 22 pages.

Ma et al., "Degradable thermosets based on labile bonds or linkages: a review," https://www.sciencedirect.com/science/article/am/pii/S0079670017300539, 80 pgs., © 2017.

Wojtecki et al., "Small Changes with Big Effects: Tuning Polymer Properties with Supramolecular Interactions," Polym. Chem. A. 2016, 54(4), 449-581.

Wojtecki et al., "Using the dynamic bond to access macroscopically responsive structurally dynamic polymers," Nature Materials 2011, 10, pp. 14-27, published online Dec. 15, 2010, DOI: 10.1038/NMAT2891.

Murphy et al., "Synthesis and Characterization of a Single-Component Thermally Remendable Polymer Network: Staudinger and Stille Revisited", Macromolecules 2008, 41, 14, pp. 5203-5209, Publication Date: Jun. 25, 2008, <https://doi.org/10.1021/ma800432g>.

PCT EP2023/051534, PCT International Search Report and Written Opinion, dated Apr. 3, 2023, 10 pages.

Wang et al., "Syntheses and Characterizations of Thermally Reworkable Epoxy Resins 11", XP-001117810, Journal of Polymer Science: Part A: Polymer Chemistry, vol. 38, pp. 3771-3782, Oct. 2000.

IBM, List of IBM Patents or Patent Applications Treated as Related, Appendix P, 2 pages, filed herewith., Feb. 1, 2024.

Magbitang et al., "Rehealable and Reworkable Electronic Packaging Materials", U.S. Appl. No. 18/426,404, filed Jan. 30, 2024, IBM Patent Reference P202302872US01, 40 pages.

Panda et al., "An Improved Synthesis of Sodium and Potassium Cyclopentadienide", Organometallics 2003, 22, 4, pp. 877-878, Publication Date: Jan. 14, 2003, https://doi.org/10.1021/om0207865.

International Searching Authority, "Notification of Transmittal of the International Search Report and the Written Opinion of the International Searching Authority, or Declaration," Patent Cooperation Treaty, Mar. 10, 2025, 15 pages, International Application No. PCT/EP2025/050360.

Magbitang, et al., Reworkable & Rehealable Packaging Materials From The Introduction Of Orthogonal Dynamic Covalent Chemistries, 21st IEEE Intersociety Conference on Thermal and Thermomechanical Phenomena in Electronic Systems (iTherm), May 31, 2022, 6 pages.

* cited by examiner

REHEALABLE AND REWORKABLE POLYMER FOR ELECTRONIC PACKAGING

BACKGROUND

The present disclosure relates to electronic packaging materials and, more specifically, to epoxy-based electronic packaging materials.

Various polymeric materials (e.g., adhesives, thermal interface materials, underfills) are used in the manufacture of semiconductor and microelectronic devices. For example, an underfill can be used in electronic packaging at a connection between a semiconductor chip and a board. When a semiconductor chip is connected to a board, electrical connections are made between electrical terminations on the chip and corresponding electrical terminations on the board. For example, these connections can be made using metallic or polymeric material that is applied in bumps (e.g., solder bumps) to the chip or board terminals. The solder bumps are then aligned and placed in contact. The resulting assembly can then be heated to reflow the metallic or polymeric material and solidify the connection. Gaps between a printed wiring board and connected components can be filled with the underfill, which can reinforce the interconnect and absorb stress from mechanical shock.

SUMMARY

Various embodiments are directed to a composition that includes a polymer formed by reacting an epoxy compound with an amine curing agent. The epoxy compound comprises a Diels-Alder dimer and an ester moiety. In some embodiments, the composition includes filler particles, which can be 40-60 wt. % of the composition. The amine curing agent can be 4,7,10-trioxatridecane-1,13-diamine or 4,4-methylenebis(2-ethylaniline). The polymer may be depolymerized by treatment with a solution of an amine and a protic solvent. The epoxy compound can be Thiele's acid diglycidyl ester. The dimer can be cyclopentadiene. The dimer may undergo reverse dimerization at temperatures of approximately 30° C. or higher. The composition can also include a radical inhibitor.

Further embodiments are directed to a process. The process includes providing a polymer formed by reacting the epoxy compound with the amine curing agent. The process can also include forming a composite material with the polymer and 40-60 wt. % filler particles. In some embodiments, the composite material is a capillary underfilling or a thermal interface material. The process can also include providing an electronic package that includes the polymer.

Additional embodiments are directed to a device. The device comprises a material that includes the polymer. In some embodiments, the material also includes and 40-60 wt. % filler particles. The material can be a capillary underfilling or a thermal interface material. The device can be a multi-chip module.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
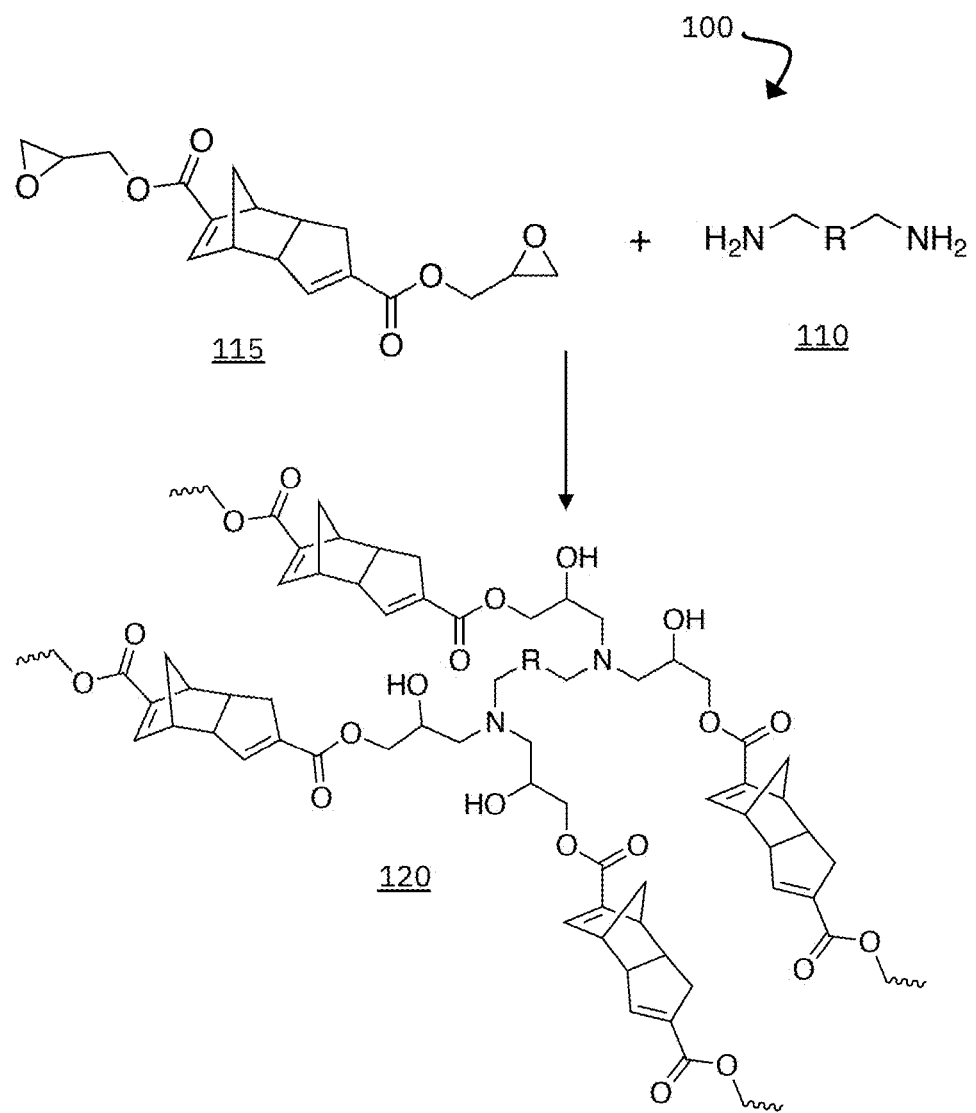
FIG. 1 is a chemical reaction diagram illustrating a process of forming an epoxy-based polymer, according to some embodiments of the present disclosure.

While the invention is amenable to various modifications and alternative forms, specifics thereof have been shown by way of example in the drawings, and will be described in detail. It should be understood, however, that the intention is not to limit the invention to the particular embodiments described. Instead, the intention is to cover all modifications, equivalents, and alternatives falling within the spirit and scope of the invention.

DETAILED DESCRIPTION

Embodiments of the present invention are generally directed to electronic packaging materials and, more specifically, to epoxy-based underfill materials. While the present disclosure is not necessarily limited to such applications, various aspects of the disclosure may be appreciated through a discussion of examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "over," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Unless otherwise noted, ranges (e.g., time, concentration, temperature, etc.) indicated herein include both endpoints and all numbers between the endpoints. Unless specified otherwise, the use of a tilde (~) or terms such as "about," "substantially," "approximately," "slightly less than," and variations thereof are intended to include the degree of error associated with measurement of the particular quantity based upon the equipment available at the time of filing the application. For example, "about" can include a range of ±8% or 5%, or 2% of a given value, range of values, or endpoints of one or more ranges of values. Unless otherwise indicated, the use of terms such as these in connection with a range applies to both ends of the range (e.g., "approximately 1 g-5 g" should be interpreted as "approximately 1 g-approximately 5 g") and, in connection with a list of ranges, applies to each range in the list (e.g., "about 1 g-5 g, 5 g-10 g, etc." should be interpreted as "about 1 g-about 5 g, about 5 g-about 10 g, etc.").

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It should also be understood that material compounds will be described in terms of listed elements, e.g., SiN, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

Turning now to an overview of technologies that are more specifically relevant to aspects of the present disclosure, in general, electronic packaging components of semiconductor and microelectronic devices can include a variety of polymeric materials, such as underfills, thermal interface materials (TIMs), adhesives, pastes, laminates, etc. For example, gaps between a printed wiring board and connected components (e.g., semiconductor chips) can be filled with an underfill in order to reinforce connections and absorb stress from mechanical shock. Epoxy-based polymeric materials are commonly used in these packaging materials. Epoxy-based materials referred to as "two-part epoxies" include an epoxy compound/monomer (part A) that is mixed with a hardening or curing agent (part B), such as a primary amine. However, cracks can form in underfills and other components because of, for example, the effect of elevated temperatures on materials with different coefficients of thermal expansion (CTEs). These cracks can propagate into surrounding components, leading to device unreliability or failure. For example, cracks in commonly used epoxy-based capillary underfills can reduce sidewall adhesion and propagate into a device's interlayer dielectric (ILD), solder, solder mask, etc.

Embodiments of the present disclosure may improve the yield and lifetime of packages and allow scaling of MCMs. In some embodiments, an epoxy-based material (e.g., a capillary underfill) is provided, which includes a polymer that can be formed by reacting an epoxy compound (part A) having ester moieties and Diels-Alder dimer moieties (e.g., dicyclopentadiene moieties) with an amine curing agent (part B). For example, the epoxy compound can be Thiele's acid diglycidyl ester (TAGE). The epoxy-based material may include a mixture of the polymer and additional material(s), such as a filler (e.g., silica particles), a radical inhibitor, etc. In some embodiments, properties of the epoxy-based material can be tuned by selection of amine curing agent and/or filler (e.g., size and composition of particles, weight percent (wt. %) filler in composite).

The disclosed epoxy-based material can be rehealable and reworkable. Healing of fractures, voids, and other defects in components such as TIMs, underfills, adhesives, etc. that include the epoxy-based material may be accomplished by application of heat to the thermally reversible Diels-Alder dimer moieties of the polymer. In some embodiments, depolymerization and removal of the material from a substrate can be carried out by treatment with a solution containing an amine and a protic solvent. This mixture can react with the ester moieties of the polymer, thereby depolymerizing the polymer so that the epoxy-based material can be rinsed away. This can allow removal of defective chips without grinding or other methods that can damage an underlying laminate and/or other device components.

Referring now to the drawings, in which like numerals represent the same or similar elements, FIG. 1 is a chemical reaction diagram illustrating a process 100 of forming an epoxy-based polymer, according to some embodiments of the present disclosure. In process 100, an amine curing agent 110 is added to an epoxy compound 115 having ester moieties and thermally reversible Diels-Alder dimer moieties. In FIG. 1 and other examples illustrated herein, this epoxy compound 115 is Thiele's acid diglycidyl ester (TAGE).

TAGE can be formed by reacting Thiele's acid (Formula 1) with glycidol (2,3-epoxy-1-propanol). Thiele's acid (TA) is a Diels-Alder dimer of cyclopentadiene carboxylate.

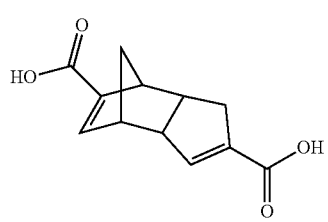

(1)

However, other appropriate epoxies may be used. For example, in some embodiments the epoxy compound 115 may be a Diels-Alder dimer of 1,3-adamantanedicarboxylic acid.

The addition of the curing agent 110 results in a polymer 120 (also referred to herein as "TAGE-amine") that may be used in electronic packaging materials. Polymer 120 has ester moieties that can undergo catalytic depolymerization when mixed with a protic solvent and an amine. Polymer 120 also has thermally reversible dicyclopentadiene moieties that can allow rehealing when a heat stimulus is applied.

Figure 2:
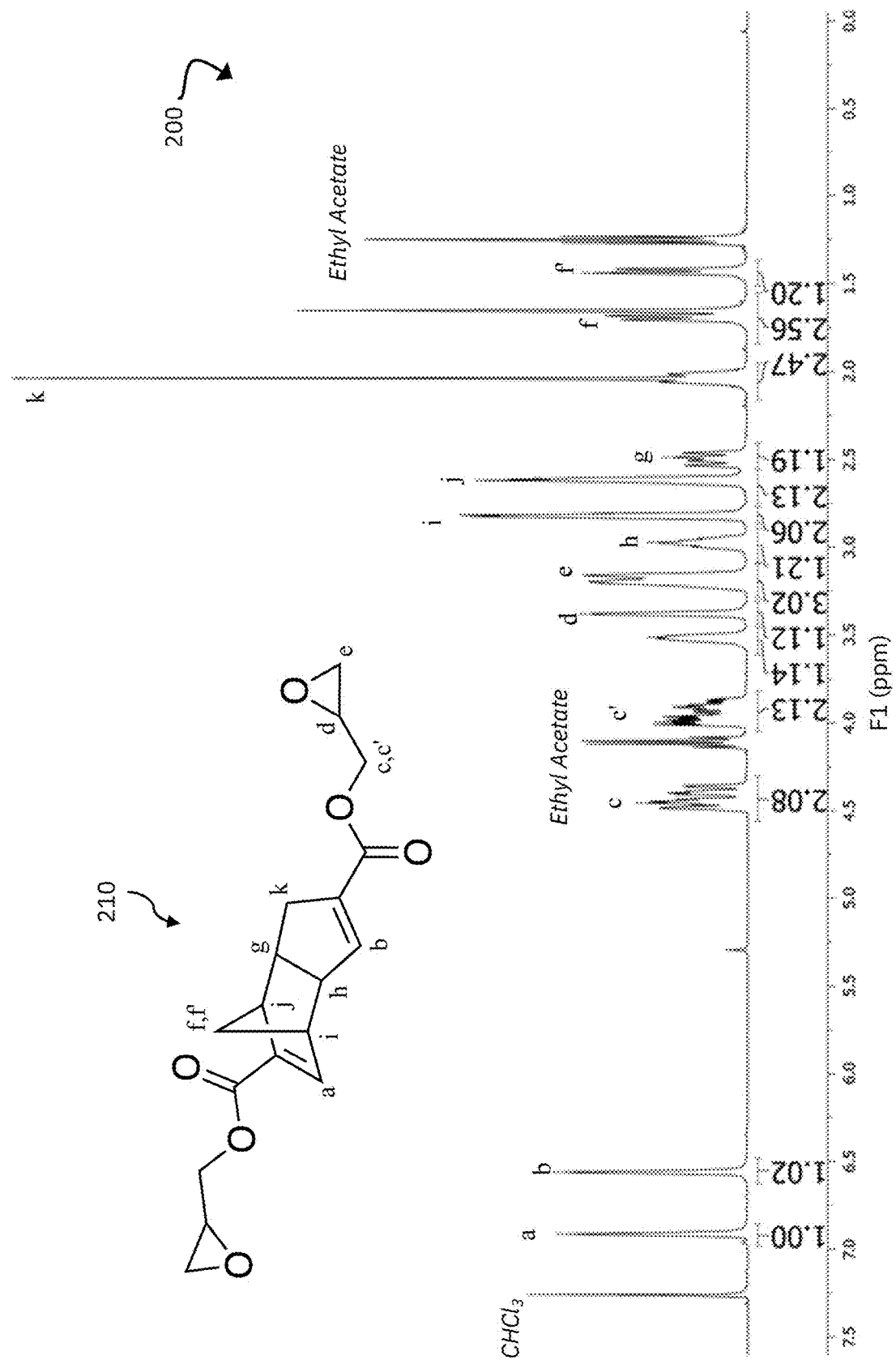
FIG. 2 illustrates a proton nuclear magnetic resonance (1H NMR) spectrum and corresponding chemical structure diagram of Thiele's acid diglycidyl ester (TAGE).

FIG. 2 illustrates a proton nuclear magnetic resonance ($^1$H NMR) spectrum 200 and corresponding chemical structure diagram 210 of TAGE. The TAGE sample from which the NMR spectrum 200 was collected was formed by mixing Thiele's acid (TA) with 1-ethyl-3-(3-dimethylaminopropyl) carbodiimide (EDC) and dimethylaminopyridine (DMAP) at room temperature in dichloromethane (DCM). In other embodiments, EDC may be replaced by another coupling agent, such as dicyclohexyl carbodiimide (DCC). The reaction mixture was stirred for about 2 hours. Glycidol was then added, resulting a crude mixture containing TAGE and about 5-10 mol % impurity (e.g., mono-substituted glycidyl ester), as determined by proton NMR. The NMR spectrum of the crude product is not shown herein.

The mono-substituted impurity was removed by column chromatography with about 20 vol. % ethyl acetate in DCM. The illustrated NMR spectrum 200 was collected from a solution of the purified TAGE product in deuterated chloroform ($CDCl_3$). Spectral peaks from solvents (ethyl acetate, DCM, and chloroform ($CHCl_3$)) and TAGE hydrogen atoms (a-j) are labeled at their appropriate positions in the NMR spectrum 200. The corresponding TAGE hydrogen atom positions (a-j) are labeled on the TAGE structure diagram 210.

Referring again to FIG. 1, the amine curing agent 110 includes two primary amine moieties ($—NH_2$) bound to carbon atoms from organic moieties that form the remainder of the molecular structure of the amine curing agent 110. These organic moieties are represented generically by R in FIG. 1 and depend on the type of curing agent used, as will be understood by those of ordinary skill in the art. The amine curing agent 110 may be any appropriate curing/hardening agent for epoxy resins. In some embodiments, the amine curing agent 110 can be a curing agent commonly used in, for example, commercially available resins such as Stycast® 1266 (manufactured by Henkel AG & Co., KGaA) (herein, "Stycast 1266") or SUMIRESIN EXCEL® CRP-4160G (Sumitomo Bakelite Co., Ltd.) (herein, "CRP-4160G"). The amine curing agents (parts B) in Stycast 1266 and CRP-4160G are referred to herein as StyB and 4160G. Structures of StyB (4,7,10-trioxatridecane-1,13-diamine) and 4160G (4,4-methylenebis(2-ethylaniline)) are respectively shown in formulas 2 and 3:

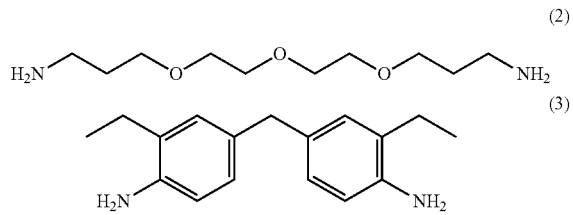

(2)

(3)

In some embodiments, the reaction to form TAGE-amine (polymer 120) is substantially free from side reactions between amine moieties (e.g., from amine curing agent 110) and cyclopentadiene moieties (from TAGE). Side reactions between amine moieties and cyclopentadiene moieties could prevent proper formation of TAGE-amine. For example, side products and crosslinks formed by these side reactions may reduce or eliminate the rehealability and/or reworkability of TAGE-amine.

Figure 3A:
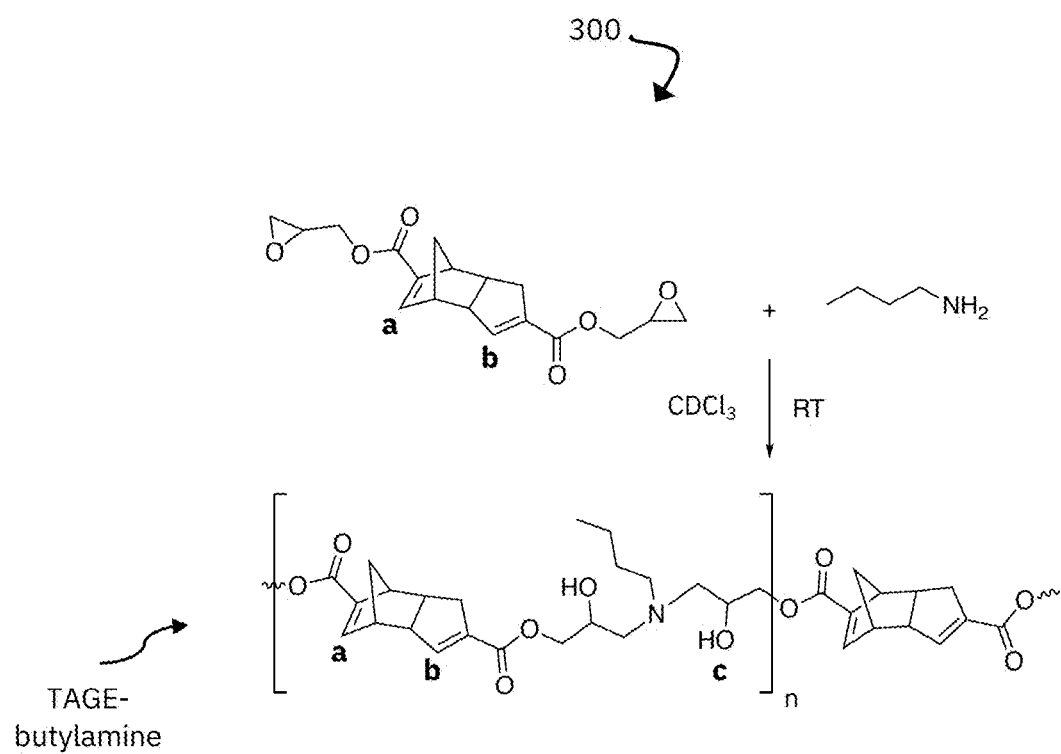
FIG. 3A is a chemical reaction diagram illustrating a reaction between TAGE and n-butylamine, according to some embodiments of the present disclosure.

FIG. 3A is a chemical reaction diagram illustrating a reaction 300 between TAGE and an amine curing agent (n-butylamine), according to some embodiments of the present disclosure. In reaction 300, TAGE is reacted at room temperature (RT) with n-butylamine to form a polymer ("TAGE-butylamine").

Figure 3B:
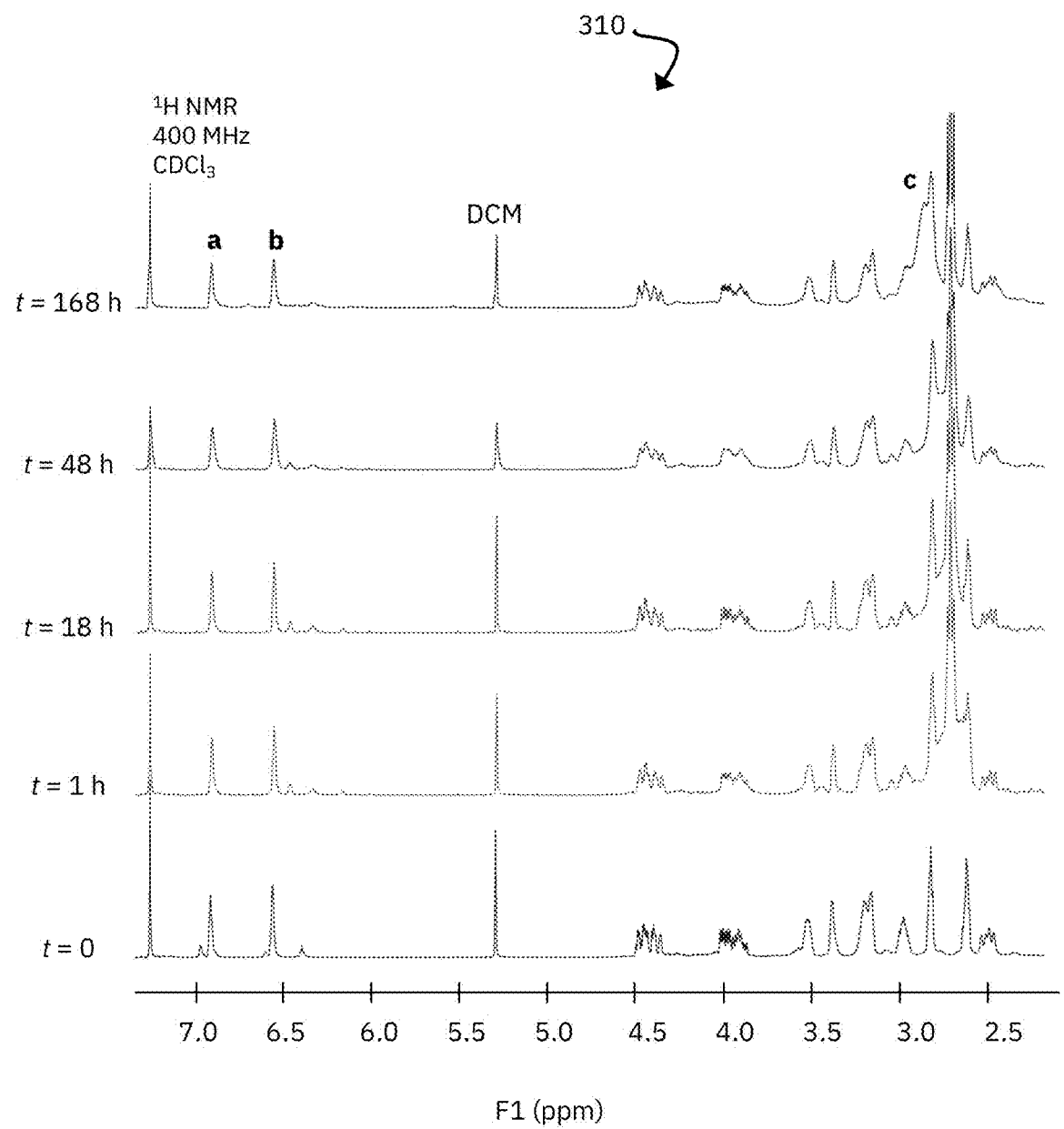
FIG. 3B is a set of 1H NMR spectra collected at five time intervals while monitoring an experimental example of the TAGE/n-butylamine reaction illustrated in FIG. 3A.
Figure 3C:
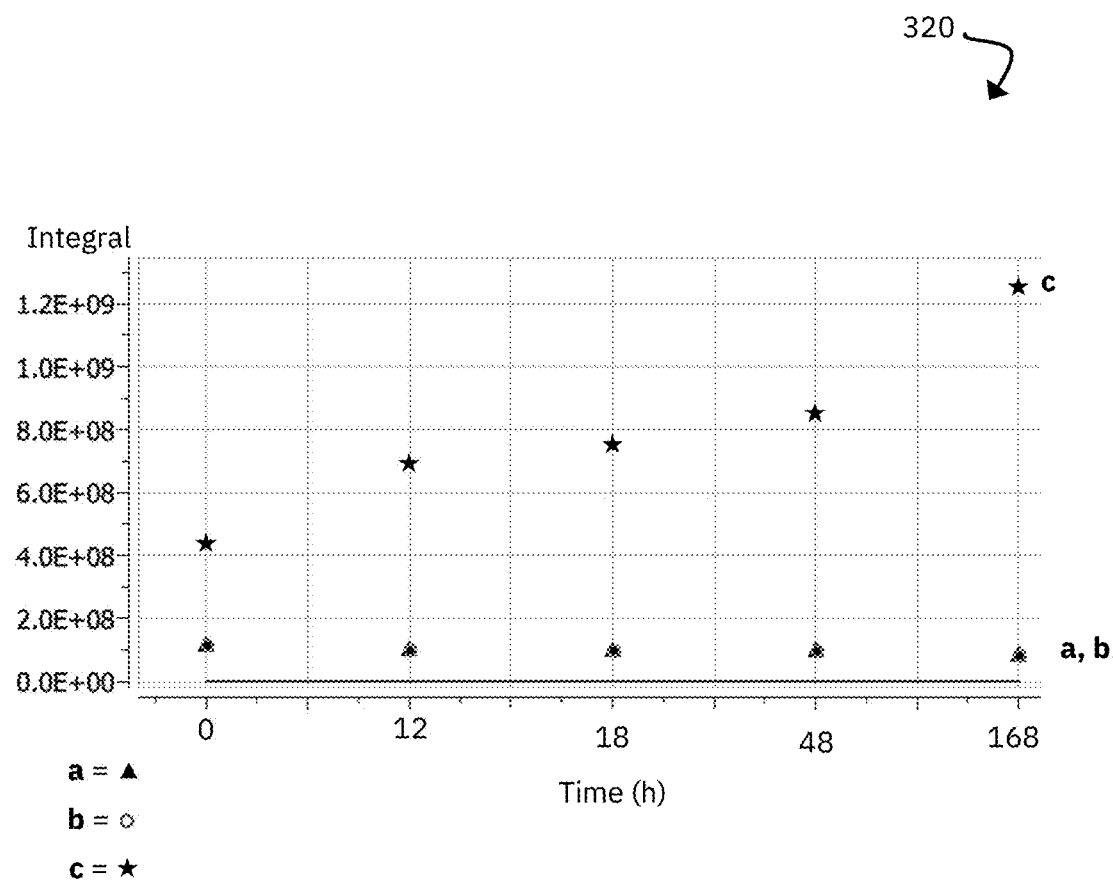
FIG. 3C is a chart showing integrated signal intensities of peaks from the NMR spectra illustrated in FIG. 3B.

FIGS. 3B and 3C illustrate results of monitoring, by proton NMR ($^1$H NMR), an experimental example of the reaction 300 between TAGE and n-butylamine. The monitored reaction 300 was carried out in $CDCl_3$ for about 168 hours. Hydrogen atom positions that can be used to follow the reaction's progress by NMR are labeled "a", "b", and "c" on the illustrated structures of TAGE and TAGE-butylamine. The NMR peaks (frequencies (F1), or chemical shifts) corresponding to these positions are labeled accordingly in FIG. 3B.

FIG. 3B is a set of $^1$H NMR spectra 310 collected at five time intervals (t=0, 1 hour, 18 hours, 48 hours, and 168 hours) while monitoring the experimental example of the TAGE/n-butylamine reaction 300 illustrated in FIG. 3A. The spectra show labeled peaks that correspond to hydrogen atoms of cyclopentadiene double bonds (labeled "a" and "b"), an internal calibrant (dichloromethane, labeled "DCM"), and hydroxyl hydrogens indicating formation of TAGE-butylamine (labeled "c").

FIG. 3C is a chart 320 showing integrated signal intensities of peaks a, b, and c from the NMR spectra 310 collected from reaction 300 at the five time intervals. The signal intensities of peaks a and b (indicating cyclopentadiene double bonds) remain substantially the same throughout reaction 300, while the signal intensity of peak c (hydroxyl groups) increases as the TAGE-butylamine polymer is formed. This indicates that TAGE-amine (polymer 120) can be formed without substantial side reactions/side products.

In some embodiments, TAGE-amine is produced using conventional reaction conditions for epoxy resin formation. An amount of filler can be added to TAGE-amine to form a composite material. For example, silica ($SiO_2$) particles with an average and/or maximum circumference of about 1 μm can be added to form a composite material with TAGE-amine and up to about 90 wt. % filler. In some embodiments, the amount of filler is between about 40-50 wt. % or 50-60 wt. %. Other examples of fillers that may be used in some embodiments can include polyhedral oligomeric silsesquioxane (POSS) particles, SiO$_2$ particles of other sizes (e.g., about 10 µm), etc.

The adhesion capacities (pull-off strengths) of TAGE-amine films formed by reacting TAGE with Stycast B and curing at about 60° C. were tested in accordance with American Society for Testing and Materials (ASTM) D4541-17 standards. Herein, "TAGE-StyB" indicates that TAGE-amine was formed using Stycast B (4,7,10-trioxatridecane-1,13-diamine) as the amine curing agent 110. Tests with TAGE-StyB (15 wt. % amine) coated on SiO$_2$ plates resulted in respective pull-off strengths of 0.5216 megapascals (MPa) and 0.8012 MPa. Tests with TAGE-amine (25% wt. % amine) coated on SiO$_2$ plates resulted in respective pull-off strengths of 22.62 MPa and 15.62 MPa. A test without TAGE, using Stycast 1266 (parts A and B) as a control, resulted in a pull-off strength of about 1-2 MPa.

Table 1 summarizes experimental details of dynamic mechanical analyses (DMA) of epoxy-amine composites. Storage (elastic) moduli E' were experimentally determined for composites of fillers and epoxy-amines. The epoxy-amines include TAGE-StyB, TAGE-4160G, BPADE-StyB (where BPADE is bisphenol A diglycidyl ether), and TAGE:BPADE-StyB (where TAGE:BPADE is a 1:1 mixture of TAGE and BPADE). Composites with different filler contents and curing conditions were tested, as shown in Table 1. Additionally, Table 1 shows coefficients of thermal expansion (CTEs) and glass transition temperatures (Tg) determined for the TAGE-StyB composites.

In some embodiments, electronic packaging epoxy-based materials that include TAGE-amine can be healed by applying a heat stimulus as in process 400. For example, TIMs, underfills, adhesives, etc. can be prepared with a TAGE-amine polymer and, in some embodiments, a radical inhibitor. In some embodiments, an amount and composition of filler added to a material can be adjusted to optimize rehealing properties.

Figure 5:
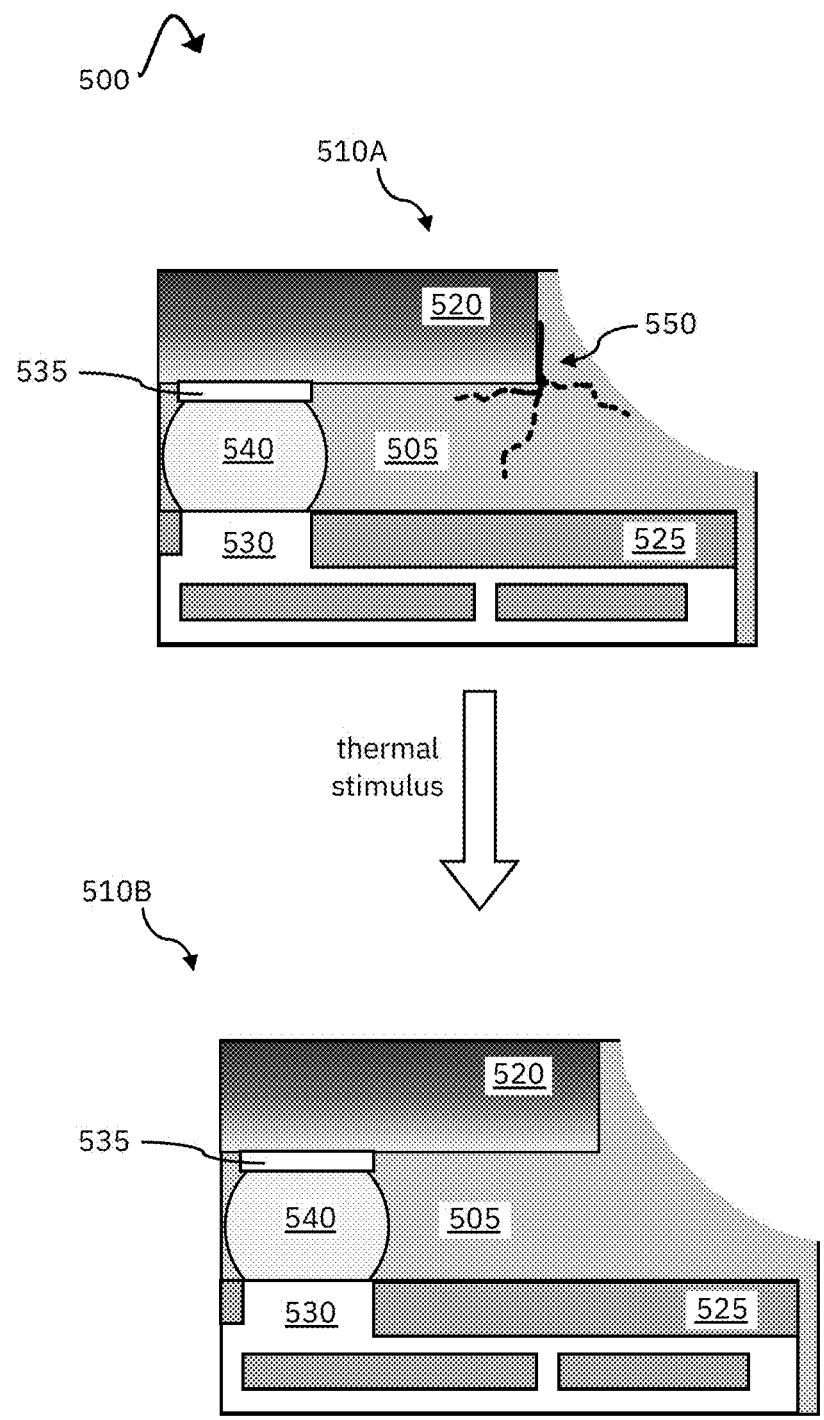
FIG. 5 is a schematic diagram illustrating a process of reheating a capillary underfill containing a TAGE-amine polymer, according to some embodiments of the present disclosure.

FIG. 5 is a schematic diagram illustrating a process 500 of rehealing a capillary underfill 505 containing TAGE-amine, according to some embodiments of the present disclosure. FIG. 5 illustrates a portion of an electronic packaging module before 510A and after 510B (collectively, "module 510") rehealing. Module 510 includes a chip 520, laminate 525, solder mask 530, and connector 535 to a solder ball 540. For illustrative purposes, additional components of module 510 are not shown. However, these components are known by those of ordinary skill and can include, for example, additional connectors and solder balls, thermal interface material (TIM), additional chips on the laminate 525, a package lid, etc.

A damaged area 550 in the capillary underfill 505 of module 510A is illustrated by a solid line representing sidewall delamination and dashed lines representing cracks propagating from the sidewall delamination into the bulk of the underfill 505. If the area 550 is not repaired, the cracks may further propagate into the chip 520, solder mask 530, solder ball 540, etc. In process 500, a heat stimulus is applied, causing the bulk underfill 505 to soften, thereby rehealing the damaged area 550. The healed underfill 505 shown in module 510B can be cooled so that it resolidifies substantially without the delamination and cracks of the damaged area 550.

TABLE 1

| Epoxy-Amine (wt. ratio) | Curing Conditions | Filler content | E' (GPa) | T$_g$ (° C.) | CTE1/CTE2 (ppm/° C.) |
|---|---|---|---|---|---|
| TAGE-StyB (85:15) | 70° C., 2 h, DMA thermal cycling[1] | 40 wt. % 1 µm SiO$_2$ | 0.08 | 45 | 55.5/— |
| TAGE-StyB (85:15) | 70° C., 2 h | 40 wt. % POSS | 0.07 | 65 | 99.4/— |
| TAGE-StyB (85:15) | 70° C., 2 h, DMA thermal cycling[1] | 40 wt. % POSS | 0.33 | 118 | 122.3/— |
| BPADE-StyB (75:25) | 120° C., 1 h | 60 wt. % 1 µm SiO$_2$ | 3.37 | — | — |
| BPADE-StyB (75:25) | 120° C., 1 h | 60 wt. % 1 µm SiO$_2$:POSS (14:1) | 3.30 | — | — |
| BPADE-StyB (75:25) | 120° C., 1 h | 60 wt. % 1 µm SiO$_2$ | 0.84 | — | — |
| TAGE-4160G (75:25) | 120° C., 1 h | 60 wt. % 1 µm SiO$_2$ | 1.13 | — | — |
| TAGE-StyB (75:25) | 120° C., 1 h, DMA thermal cycling[2] | 60 wt. % 1 µm SiO$_2$ | 3.5-3.75 | 110-130 | 35.5/72.6 |
| TAGE-StyB (75:25) | 120° C., 2 h, DMA thermal cycling[3] | 60 wt. % 1 µm SiO$_2$ + dried | 7.5-8.15 | 88-97 | 38.0/66.1 |
| 1:1 TAGE:BPADE-StyB (75:25) | 120° C. | 60 wt. % 1 µm SiO$_2$ | 3.9-4.10 | 103-110 | 46.2/83.0 |

[1]Thermal ramp from 25° C. to 120° C. 1X (5° C./min; isotherm for 1 h at 120° C.; cool back to 25° C.)
[2]Thermal ramp from 25° C. to 150° C. 1X (2° C./min; isotherm for 10 min at 150° C.; cool back to 25° C.)
[3]Thermal ramp from 25° C. to 150° C. 3X (2° C./min; isotherm for 10 min at 150° C.; cool back to 25° C.)

Figure 4:
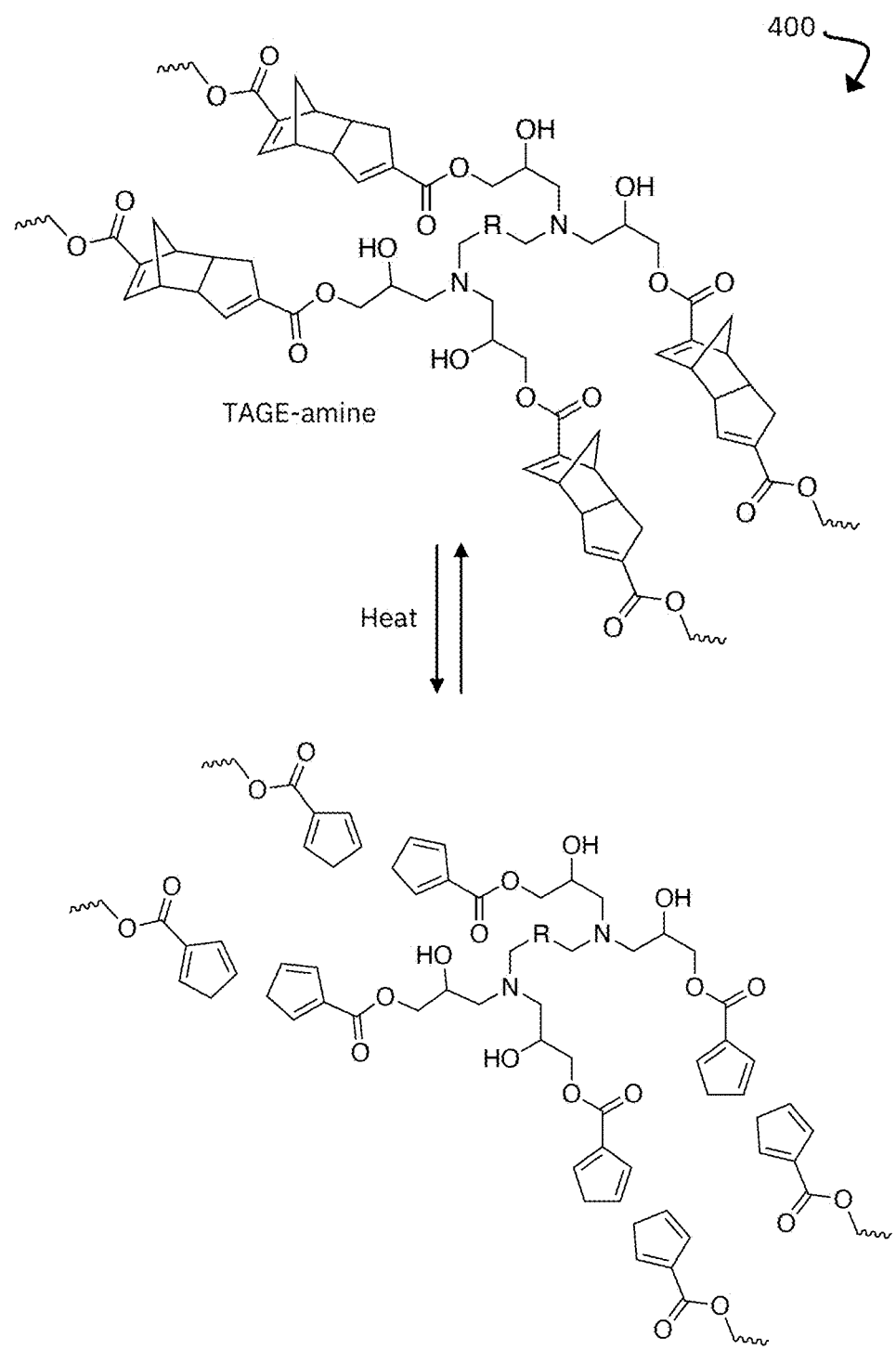
FIG. 4 is a chemical reaction diagram illustrating a process of heating a TAGE-amine polymer, according to some embodiments of the present disclosure.

FIG. 4 is a chemical reaction diagram illustrating a process 400 of heating/rehealing TAGE-amine, according to some embodiments of the present disclosure. The illustrated TAGE-amine can be formed according to process 100 (FIG. 1). When the temperature of TAGE-amine is raised (e.g., to about 120° C.), reverse dimerization of the cyclopentadiene moieties can occur, thereby "softening" the polymer. When the temperature is lowered, the cyclopentadiene moieties can dimerize again, thereby "healing" the polymer.

In some embodiments, rehealable TAGE-amine materials can include a radical inhibitor (e.g., butylated hydroxytoluene (BHT), phenothiazine, etc.). This can prevent side reactions during process 400 that would prevent rehealing.

In a profilometric measurement (not shown), a cracked film of TAGE-4160G was heated at 90° C. for about 30 minutes. Profilometry before and after this rehealing cycle determined that the size of the crack was reduced by about 99% (from 13 µm to ~180 nm).

The selection of amine curing agent may be used to tune properties of TAGE-amine. For example, the amount of softening in response to a heat stimulus can vary. This can be demonstrated using DMA to measure changes in storage modulus. Experimental DMA results were obtained while applying a heat stimulus to two examples of TAGE-amine films. One example film was formed using Stycast B as an amine curing agent ("TAGE-StyB"), and the other example film was formed using 4160 B as an amine curing agent ("TAGE-4160B"). The heat stimulus was applied by heating each film from 25° C. to 120° C. (5° C./minute). When the heat stimulus was applied to TAGE-StyB, its storage modulus changed from 80 MPa to 11 MPa (86% softening). When the heat stimulus was applied to TAGE-4160B, its storage modulus changed from 447 MPa to 18 MPa (96% softening).

In some embodiments, cured TAGE-amine films and materials/composites containing TAGE-amine can be removed from a substrate using a mixture of a protic solvent and an amine catalyst (referred to herein as a "depolymerizing mixture"). Examples of protic solvents that may be used can include methanol, ethanol, isopropanol, glycerol, etc. In some embodiments, the depolymerization mixture can include an amine catalyst such as triethylamine (TEA) or 1,8-diazabicyclo [5.4.0]undec-7-ene (DBU). The depolymerization mixture may be reacted with TAGE-amine while heating in a solvent such as N-methylpyrrolidone (NMP). In an experimental example, a TAGE-StyB film was removed by treating the film with a depolymerization mixture of methanol and TEA (e.g., about 16 wt. % TEA) in NMP at 50-60° C. In another experimental example, a TAGE-StyB film was removed by treating the film with a depolymerization mixture of glycerol and DBU (e.g., about 2 wt. % DBU) for 20-30 minutes at 175° C.

Figure 6:
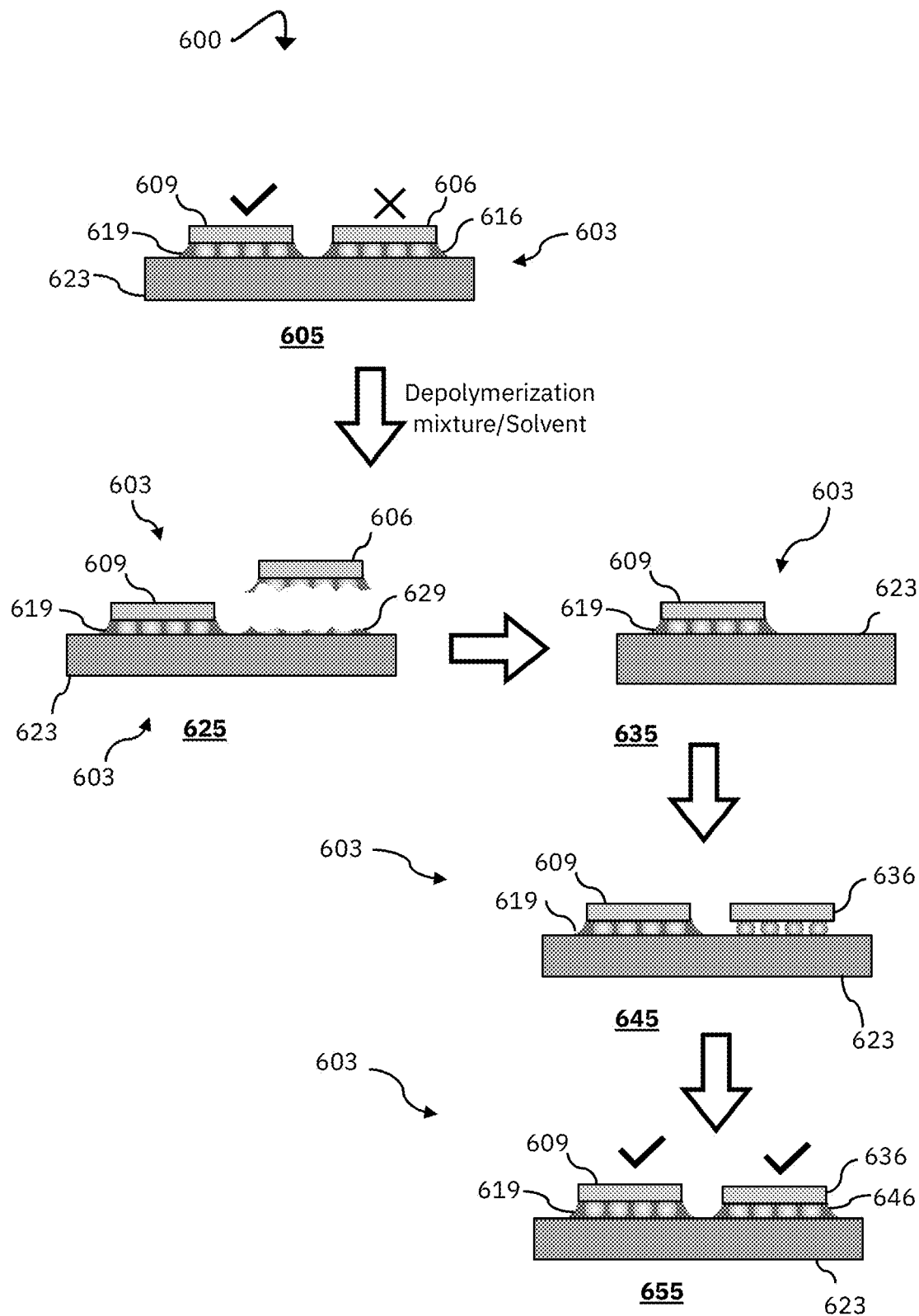
FIG. 6 is a schematic diagram illustrating a process 600 of repairing a multi-chip module by reworking an epoxy-based material containing TAGE-amine, according to some embodiments of the present disclosure.

FIG. 6 is a schematic diagram illustrating a process 600 of repairing a multi-chip module 603 ("module 603") by reworking an epoxy-based material containing TAGE-amine, according to some embodiments of the present disclosure. At operation 605, it can be determined that module 603 includes a defective chip 606 (indicated by an "X" in FIG. 6) and a chip 609 that is operating normally (indicated by a check mark in FIG. 6). Both chips 606 and 609 are connected to a laminate 623 by layers of underfill 616 and 619 and solder balls (represented by gray spheres).

The defective chip 606 can be removed from the laminate 623. This is illustrated at operation 625. The underfill 616 below the defective chip can be a TAGE-amine and filler composite material (e.g., TAGE-StyB with 50-60 wt. % ~1 µm SiO$_2$ particle filler). The underfill 616 can be treated with a solution/bath containing a solvent/amine depolymerization mixture such as those discussed above (e.g., methanol/TEA, glycerol/DBU, etc.). Further, as discussed above, heat can be applied while treating the underfill 616. Upon depolymerization of the underfill 616, the defective chip 606 can be removed from the module 603.

A residue 629 may remain on the laminate 623 after the removal. This residue 629 can contain TAGE-amine, filler particles, etc. However, removal of the residue 629 can be accomplished by further treatment with the depolymerization mixture, heat, and/or solvent rinsing. This is illustrated at operation 635. In other embodiments, there may be no residue left after removing the defective chip 606. In these instances, the cleaning process at operation 635 may be optionally omitted.

A new chip 636 can be connected to module 603 after removing the defective chip 606. This is illustrated at operation 645. The new chip 636 can be connected by solder balls (gray spheres in FIG. 6) using any appropriate techniques known in the art. A new layer 646 of capillary underfill can then be added below the new chip 636, surrounding the solder balls. This is illustrated at operation 655. In some embodiments, the new underfill layer 639 is a TAGE-amine composite material. In these instances, process 600 may be repeated if the new chip 636 becomes defective in the future. However, any appropriate capillary underfill may be used. At operation 655, it can be determined that the new chip 636 and remaining original chip 609 are working (indicated by check marks).

In some embodiments, reworking/depolymerization processes such as process 600 can be carried out on multichip modules with more than two chips. However, the protic solvent/amine depolymerization process of removing a chip may be used on any appropriate package module that includes TAGE-amine underfilling. In further embodiments, this depolymerization process can be used to remove TAGE-amine materials other than underfills (e.g., TIMs, adhesives, etc.).

The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A process, comprising:
   providing a polymer comprising thermally reversible repeat units, wherein:
      the polymer is formed by curing a Diels-Alder dimer with an amine curing agent; and
      the Diels-Alder dimer comprises an epoxy moiety and an ester moiety;
   providing a chip connected to a first location on a laminate by solder balls and by an underfill comprising the polymer; and
   removing the chip from the laminate by, while applying heat, treating the underfill with a depolymerization mixture comprising an amine catalyst and a protic solvent.

2. The process of claim 1, further comprising providing a composite material containing the polymer and about 40-60 wt. % filler particles.

3. The process of claim 2, wherein the composite material is selected from the group consisting of a capillary underfilling and a thermal interface material.

4. The process of claim 1, wherein the polymer is removable from a substrate by treatment with the depolymerization mixture.

5. The process of claim 1, further comprising:
   providing an electronic package that includes an underfill comprising the polymer; and
   healing a defect in the underfill, wherein the healing comprises heating the underfill to about 120° C.

6. The process of claim 1, wherein the polymer is rehealable at temperatures of approximately 30° C. or higher.

7. The process of claim 1, further comprising mixing the polymer with a radical inhibitor.

8. The process of claim 1, further comprising:
   cleaning residue from the first location on the laminate, wherein the cleaning comprises using the depolymerization mixture to remove the residue; and
   connecting a new chip to the laminate at the cleaned first location.

9. The process of claim 1, wherein the amine catalyst is selected from the group consisting of triethylamine (TEA) and 1,8-diazabicyclo[5.4.0]undec-7-ene (DBU).

10. The process of claim 1, wherein the polymer has the following structure:

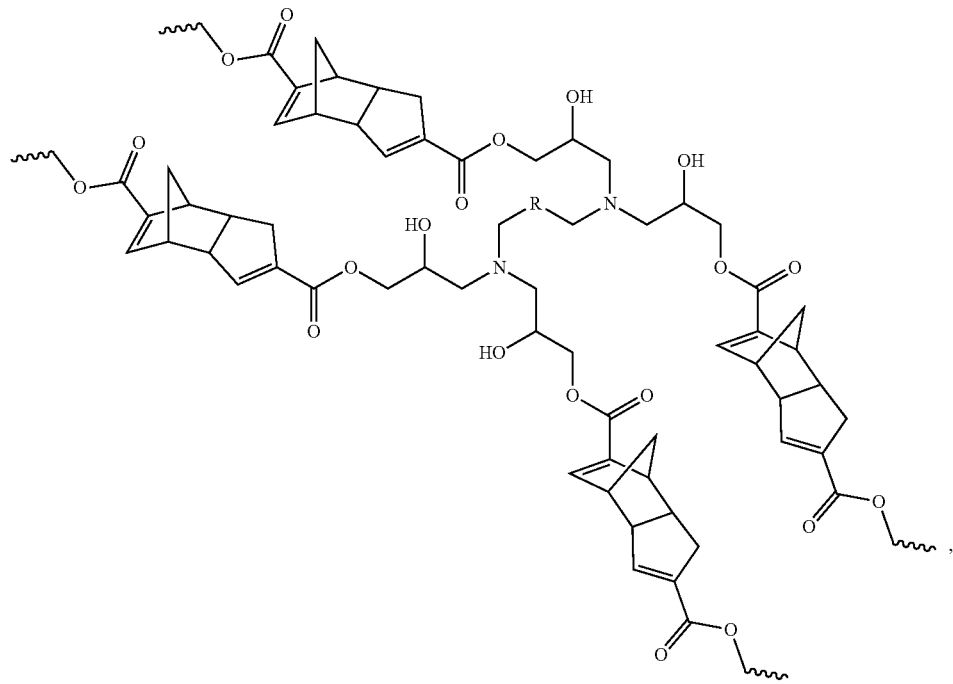

wherein R is an organic moiety.

11. The process of claim 1, wherein the Diels-Alder dimer is Thiele's acid diglycidyl ester.

12. The process of claim 1, wherein the Diels-Alder dimer comprises a cyclopentadiene moiety.

13. The process of claim 1, wherein the amine curing agent is 4,7,10-trioxatridecane-1,13-diamine.

14. The process of claim 1, wherein the amine curing agent is 4,4-methylenebis (2-ethylaniline).

15. The process of claim 1, wherein the thermally reversible repeat units are able to undergo reverse dimerization at temperatures below 130° C.

16. The process of claim 1, wherein the amine catalyst is triethylamine (TEA) and the protic solvent is methanol.

17. The process of claim 16, wherein the applying heat comprises heating the depolymerization mixture to about 50-60° C.

18. The process of claim 16, wherein the depolymerization mixture further comprises N-methylpyrrolidone.

19. The process of claim 1, wherein the amine catalyst is 1,8-diazabicyclo[5.4.0]undec-7-ene (DBU) and the protic solvent is glycerol.

20. The process of claim 19, wherein the applying heat comprises heating the depolymerization mixture to about 175° C.

* * * * *